(12) United States Patent
Lehr et al.

(10) Patent No.: US 8,283,247 B2
(45) Date of Patent: Oct. 9, 2012

(54) SEMICONDUCTOR DEVICE INCLUDING A DIE REGION DESIGNED FOR ALUMINUM-FREE SOLDER BUMP CONNECTION AND A TEST STRUCTURE DESIGNED FOR ALUMINUM-FREE WIRE BONDING

(75) Inventors: Matthias Lehr, Dresden (DE); Frank Kuechenmeister, Dresden (DE); Steffi Thierbach, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 125 days.

(21) Appl. No.: 12/116,514

(22) Filed: May 7, 2008

(65) Prior Publication Data
US 2009/0140244 A1 Jun. 4, 2009

(30) Foreign Application Priority Data
Nov. 30, 2007 (DE) .......................... 10 2007 057 689

(51) Int. Cl.
*H01L 21/44* (2006.01)
(52) U.S. Cl. ................. 438/614; 438/612; 257/E21.582
(58) Field of Classification Search .................. 438/612, 438/614, 613; 257/737, 738, 758, 781, 784, 257/E23.02
See application file for complete search history.

(56) References Cited

U.S. PATENT DOCUMENTS

| 6,764,879 | B2 * | 7/2004 | Nagao et al. | 438/110 |
|---|---|---|---|---|
| 2002/0000665 | A1 | 1/2002 | Barr et al. | 257/758 |
| 2004/0262755 | A1 * | 12/2004 | Huang | 257/737 |
| 2005/0017355 | A1 * | 1/2005 | Chou et al. | 257/738 |
| 2005/0073048 | A1 | 4/2005 | Bojkov et al. | 257/737 |
| 2005/0224966 | A1 * | 10/2005 | Fogel et al. | 257/737 |
| 2005/0224972 | A1 * | 10/2005 | Domon et al. | 257/737 |
| 2006/0231951 | A1 * | 10/2006 | Jan et al. | 257/737 |
| 2006/0249848 | A1 * | 11/2006 | Coolbaugh et al. | 257/758 |
| 2008/0006945 | A1 * | 1/2008 | Lin et al. | 257/758 |
| 2008/0099913 | A1 * | 5/2008 | Lehr et al. | 257/737 |
| 2008/0150161 | A1 * | 6/2008 | Lin et al. | 257/778 |
| 2009/0166861 | A1 * | 7/2009 | Lehr et al. | 257/737 |

FOREIGN PATENT DOCUMENTS
WO WO 2007/036867 4/2007

OTHER PUBLICATIONS

Translation of Official Communication from German Patent Office for German Patent Application No. 10 2007 057 689.9-33 dated Aug. 14, 2008.
PCT Search Report and Written Opinion from PCT/US2008/012989 dated Jun. 16, 2009.

* cited by examiner

*Primary Examiner* — Chuong A Luu
*Assistant Examiner* — Nga Doan
(74) *Attorney, Agent, or Firm* — Williams, Morgan & Amerson, P.C.

(57) ABSTRACT

In sophisticated semiconductor devices including copper-based metallization systems, a substantially aluminum-free bump structure in device regions and a substantially aluminum-free wire bond structure in test regions may be formed on the basis of a manufacturing process resulting in identical final dielectric layer stacks in these device areas. The number of process steps may be reduced by making a decision as to whether a substrate is to become a product substrate or test substrate for estimating the reliability of actual semiconductor devices. For example, nickel contact elements may be formed above copper-based contact areas wherein the nickel may provide a base for wire bonding or forming a bump material thereon.

18 Claims, 8 Drawing Sheets

SEMICONDUCTOR DEVICE INCLUDING A DIE REGION DESIGNED FOR ALUMINUM-FREE SOLDER BUMP CONNECTION AND A TEST STRUCTURE DESIGNED FOR ALUMINUM-FREE WIRE BONDING

BACKGROUND OF THE INVENTION

1. Field of the Invention

The present disclosure generally relates to the formation of integrated circuits, and, more particularly, to a back end of line processing for providing a bump structure arranged for direct solder bump connection in a die area while enabling wire bonding of bond pads located outside the die area, such as the frame region of semiconductor devices.

2. Description of the Related Art

In manufacturing integrated circuits, it is usually necessary to package a chip and provide leads and terminals for connecting the chip circuitry with the periphery. In some packaging techniques, chips, chip packages or other appropriate units may be connected by means of solder balls, formed from so-called solder bumps, that are formed on a corresponding layer of at least one of the units, for instance, on a dielectric passivation layer of the microelectronic chip. In order to connect the microelectronic chip with the corresponding carrier, the surfaces of two respective units to be connected, i.e., the microelectronic chip comprising, for instance, a plurality of integrated circuits, and a corresponding package, have formed thereon adequate pad arrangements to electrically connect the two units after reflowing the solder bumps provided at least on one of the units, for instance, on the microelectronic chip. In other techniques, solder bumps may have to be formed that are to be connected to corresponding wires, or the solder bumps may be brought into contact with corresponding pad areas of another substrate acting as a heat sink. Consequently, it may be necessary to form a large number of solder bumps that may be distributed over the entire chip area, thereby providing, for example, the I/O (input/output) capability as well as the desired low-capacitance arrangement required for high frequency applications of modern microelectronic chips that usually include complex circuitry, such as microprocessors, storage circuits and the like, and/or include a plurality of integrated circuits forming a complete complex circuit system.

In modern integrated circuits, highly conductive metals, such as copper and alloys thereof, are used to accommodate the high current densities encountered during the operation of the devices. Consequently, the metallization layers may comprise metal lines and vias formed from copper or copper alloys, wherein the last metallization layer may provide contact areas for connecting to the solder bumps to be formed above the copper-based contact areas. The processing of copper in the subsequent process flow for forming the solder bumps, which is itself a highly complex manufacturing phase, may be performed on the basis of the well-established metal aluminum that has effectively been used for forming solder bump structures in complex aluminum-based microprocessors. For this purpose, an appropriate barrier and adhesion layer is formed on the copper-based contact area, followed by an aluminum layer. Subsequently, the contact layer including the solder bumps is formed on the basis of the aluminum-covered contact area.

In order to provide hundreds or thousands of mechanically well-fastened solder bumps on corresponding pads, the attachment procedure of the solder bumps requires a careful design since the entire device may be rendered useless upon failure of only one of the solder bumps. For this reason, one or more carefully chosen layers are generally placed between the solder bumps and the underlying substrate or wafer including the aluminum-covered contact areas. In addition to the important role these interfacial layers, herein also referred to as underbump metallization layers, may play in endowing a sufficient mechanical adhesion of the solder bump to the underlying contact area and the surrounding passivation material, the underbump metallization has to meet further requirements with respect to diffusion characteristics and current conductivity. Regarding the former issue, the underbump metallization layer has to provide an adequate diffusion barrier to prevent the solder material, frequently a mixture of lead (Pb) and tin (Sn), from attacking the chip's underlying metallization layers and thereby destroying or negatively affecting their functionality. Moreover, migration of solder material, such as lead, to other sensitive device areas, for instance into the dielectric, where a radioactive decay in lead may also significantly affect the device performance, has to be effectively suppressed by the underbump metallization. Regarding current conductivity, the underbump metallization, which serves as an interconnect between the solder bump and the underlying metallization layer of the chip, has to exhibit a thickness and a specific resistance that does not inappropriately increase the overall resistance of the metallization pad/solder bump system. In addition, the underbump metallization will serve as a current distribution layer during electroplating of the solder bump material. Electroplating is presently the preferred deposition technique, since physical vapor deposition of solder bump material, which is also used in the art, requires a complex mask technology in order to avoid any misalignments due to thermal expansion of the mask while it is contacted by the hot metal vapors. Moreover, it is extremely difficult to remove the metal mask after completion of the deposition process without damaging the solder pads, particularly when large wafers are processed or the pitch between adjacent solder pads decreases.

The complexity of advanced semiconductor devices, such as CPUs and the like, typically requires the provision of specifically designed test structures for estimating the quality and thus reliability of the manufacturing flow and the materials used. As one important example for a front end of line process, the gate dielectrics of field effect transistors may be mentioned, the quality of which has to be monitored in order to enable an assessment of the operational behavior of the transistor devices. Similarly, many back end of line processes may require a thorough monitoring, such as the electromigration behavior, or generally stress-induced degradation of sophisticated wiring structures, in particular, as typically increasingly low-k dielectric materials are used in the wiring level in combination with highly conductive metals, such as copper and the like. The specifically designed test structures are typically not provided within the actual die region to avoid consumption of precious chip area, but are positioned in the periphery, such as the scribe lane for dicing the substrate prior to packaging. Although the direct connection of the die area with an appropriate carrier substrate via the bump structure is a preferred technique for complex circuits, the assembly of the test structure may typically be accomplished on the basis of well-approved wire bond techniques, since wire bonding of the test structures to respective packages may be cheaper and faster compared to a direct solder bump connection. Moreover, generally the pitch between bond pads may be selected less compared to an arrangement of solder bumps in the test structure.

Wire bonding techniques are well established for aluminum-based bond pads, while also well-established techniques are available for forming solder bump structures on the basis of aluminum. On the other hand, since the formation of aluminum-based solder bump structures may result in a more complex process flow compared to approaches for directly forming bump structures on the basis of copper-based contact areas in sophisticated metallization systems provided on the basis of copper, possibly in combination with low-k dielectric materials, great efforts are being made in establishing process techniques for avoiding the usage of aluminum in the back end of line (BEOL) process. However, a bonding on copper bond pads is very difficult to achieve due to an inhomogeneous self-oxidization of the copper surface in combination with extensive corrosion, which may result in highly non-reliable bond connections. For this reason, metallization systems including actual die regions and respective test structures may nevertheless be manufactured on the basis of aluminum in an attempt to utilize well-established infrastructure of aluminum-based bump structure techniques in combination with well-approved wire bond processes, thereby however contributing to enhanced process complexity for copper-based metallization systems, as will be described in more detail with reference to FIGS. 1a-1d.

FIG. 1a schematically illustrates a cross-sectional view of a conventional semiconductor device 100 in an advanced manufacturing stage. The semiconductor device 100 comprises a substrate 101, which may have formed therein circuit elements and other microstructural features that are, for convenience, not shown in FIG. 1a. Moreover, the device 100 comprises one or more metallization layers including copper-based metal lines and vias wherein, for convenience, the very last metallization layer 107 is shown, which may comprise a dielectric material 107A having formed therein a first copper-based metal region 107D and a second copper-based metal region 107T. That is, the metal regions 107D and 107T may be formed of copper or a copper alloy, possibly in combination with respective barrier materials (not shown), so as to suppress any interaction between the dielectric material 107A and the copper material. The metal region 107D may be electrically connected to any circuit elements representing an integrated circuit in accordance with a specific circuit arrangement, while the metal region 107T may represent a contact area connected to respective device features representing a test structure to characterize specific device properties, such as electromigration performance, reliability of gate dielectrics and the like. Thus, the portion of the metallization layer 107 including the contact area 107D may correspond to a die or device region 150D, while the portion of the metallization layer 107 comprising the contact area 107T may correspond to a test region 150T of the device 100. For example, the device region 150D may represent a die region, which may, after dicing the device 100 into separate entities, represent a single functional unit, while the test region 150T, which may not be operationally connected to the device region 150D, may represent a respective area in the device 100 that may not be utilized when operating a respective circuit in the device region 150D. For instance, the device region 150D may represent a die area which is separated from the test region 150T by a die seal (not shown) which is typically used for protecting an actual die area from being damaged during dicing the substrate.

The semiconductor device 100 further comprises a cap layer 106 that is formed of an appropriate material, such as silicon nitride, silicon carbide, nitrogen-containing silicon carbide and the like, so as to confine the copper material of the non-exposed portions of the contact areas 107D, 107T. Moreover, a first passivation layer 103A is provided, for instance, comprised of silicon dioxide, silicon oxynitride and the like. Furthermore, a second passivation layer 103B may be provided, for instance in the form of silicon dioxide, silicon oxynitride and the like. As shown, the passivation layers 103A, 103B exposes an appropriate portion of the contact areas 107D, 107T as is required for forming respective solder bumps in the device region 150D in a later manufacturing stage and for forming aluminum-based bond pads for wire bonding in the test region 150T. As previously explained, providing different contact regimes for connecting the device region 150D and the test region 150T to a respective carrier substrate may result in enhanced process efficiency with respect to obtaining test structures on the basis of the regions 150T.

The semiconductor device 100 as shown in FIG. 1a may be formed on the basis of the following processes. Initially, the substrate 101 and any circuit elements contained therein may be manufactured on the basis of well-established process techniques, wherein, in sophisticated applications, circuit elements having critical dimensions on the order of magnitude of approximately 50 nm and less may be formed, followed by the fabrication of the one or more metallization layers 107 which may include copper-based metal lines and vias, wherein typically low-k dielectric materials are used for at least some of the dielectric material, such as the material 107A. Forming the metallization layer 107 may include the deposition of a cap layer 106, thereby confining any copper-based materials, such as the regions 107D, 107T. Next, the passivation layers 103A, 103B may be formed on the cap layer 106 on the basis of any appropriate deposition technique, such as plasma enhanced chemical vapor deposition (PECVD) and the like. Thereafter, a photolithography process is performed to provide a photoresist mask (not shown) having a shape and dimension that substantially determines the actual contact area for connecting to a bump structure in the device region 150D and to a wire bonding pad in the region 150T. Subsequently, the layer stack 103 may be opened on the basis of the previously defined resist mask, which may then be removed by well-established processes.

FIG. 1b schematically illustrates the conventional semiconductor device 100 in a further advanced manufacturing stage in which a barrier/adhesion layer 104 may be formed on the contact areas 107D, 107T, as well as on sidewall portions and a part of the horizontal portion of the passivation layers 103A, 103B. The barrier/adhesion layer 104 may, for instance, be comprised of tantalum, tantalum nitride, titanium, titanium nitride or other similar metals and compounds thereof as are typically used in combination with copper metallization systems in order to effectively reduce copper diffusion and enhance adhesion for an aluminum layer 105. Typically, the device 100 as shown in FIG. 1b may be formed by first depositing the barrier/adhesion layer 104, for instance, on the basis of sputter deposition techniques, followed by the deposition of the aluminum layer 105, for instance, on the basis of sputter deposition, chemical vapor deposition and the like. Next, a lithography process is performed, thereby forming a resist mask (not shown), which may be used as an etch mask during a reactive etch process, which may, for instance, be performed on the basis of complex chlorine-based etch chemistries to obtain the patterned aluminum layer 105 as shown in FIG. 1b. Furthermore, the respective etch process may also include a separate etch step for etching through the barrier/adhesion layer 104 followed by a wet chemical process for removing any corrosive etch residues generated during the complex aluminum etch step.

FIG. 1c schematically illustrates the semiconductor device 100 in a further advanced manufacturing stage in which a further passivation layer 103C is formed above the device 100, which may also be referred to as a final passivation layer, since the layer 103C may represent the last dielectric layer in and above which the bump structure is to be formed in the device region 150D. On the other hand, the passivation layer 103C which, in combination with the passivation layers 103A, 103B, may thus represent a final passivation layer stack 103, may be patterned so as to expose significant portions of the test region 150T, thereby providing a desired surface topography for enabling wire bonding of the respective aluminum layer 105 in a later stage. The passivation layer 103C may be provided in the form of a photosensitive polyimide material which may be patterned on the basis of photolithographical exposure and "development" to obtain the substantially exposed test region 150T and a respective opening for exposing at least a significant portion of the aluminum layer 105 in the device region 150D. After patterning the final passivation layer 103C, an appropriate resist mask (not shown) may be formed to define the lateral dimension of a solder bump in the device region 150D, while essentially covering the test region 150T so as to avoid deposition of solder material therein. It should be appreciated that the device region 150D may comprise a plurality of exposed aluminum-based metal regions in accordance with the device requirements, wherein substantially the entire surface area of the device region 150D may be available for providing respective solder bumps. On the other hand, the contact areas 107T in the test region 150T may be arranged with appropriate distances to allow for the required number of input/output terminals, while also respective pre-conditions are obtained for performing a wire bonding process in a later manufacturing stage during the assembly of a test structure on the basis of a test region 150T. Prior to forming the respective resist mask, an appropriate conductive liner system, which may also be referred to as underbump metallization layer system, may be formed which may comprise two or more separate layers with appropriate conductive materials, such as titanium, tungsten and the like, that are frequently used in view of diffusion blocking characteristics, adhesion and the like. Furthermore, one or more additional layers may be provided to act as an appropriate base layer for a subsequent electroplating process to fill in an appropriate solder material, such as tin and lead, or any other solder materials, such as lead-free compositions and the like, into openings defined in the resist mask.

FIG. 1d schematically illustrates the semiconductor device 100 after the above-described process sequence and after the removal of any resist material. Hence, the device 100 comprises a solder bump 109 formed on an underbump metallization layer 108, which may comprise two or more sub-layers 108A, 108B, depending on the process and device requirements. On the other hand, in the test region 150T, the aluminum layer 105 thus defines a bond pad that is configured for being wire bonded during the assembly of a respective test structure on the basis of the test region 150T, as previously explained.

Consequently, in the conventional approach described above, efficient wire bond techniques may be used for assembling the test region 150T while the solder bumps 109 may be provided in the device region 150D thereby, however, requiring a complex process sequence for depositing and patterning the barrier/adhesion layer 104 and the aluminum layer 105, while also resulting in significantly different passivation layer stacks in the device region 150D and the test region 150T. That is, due to the wire bonding process to be performed at a later stage, significant portions of the test region 150T may no longer include the final passivation layer 103C, which may reduce the authenticity of respective measurement results obtained on the basis of the test region 150T compared to the actual device regions 150D.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique and respective semiconductor devices in which a bump structure is formed in device regions on the basis of a copper-based metal region, thereby avoiding highly complex deposition and patterning processes for forming barrier/adhesion layers and aluminum material, while also providing the possibility of enabling wire bonding in respective test regions and avoiding aluminum-based process steps. Moreover, the subject matter disclosed herein provides substantially similar final passivation layer stacks in test regions and actual device regions which, in some illustrative aspects, may be accomplished in the same substrates when substrates are contemplated that are dedicated for reliability tests. Consequently, the present disclosure enables the highly efficient process technique for forming bump structures in device regions and wire bonding structures in test regions without requiring aluminum-based techniques, thereby freeing resources in terms of equipment and clean room areas that would otherwise be required for the aluminum technology, while nevertheless providing the advantages associated with the wire bonding of respective test structures.

One illustrative method disclosed herein comprises forming a final dielectric layer stack above a last metallization layer that is formed above a substrate, wherein the last metallization layer comprises a first contact area connected to a device region including a semiconductor device and a second contact area connected to a test region. The method further comprises patterning the final dielectric layer stack in order to expose the first and second contact areas and forming a metal stack on the first and second contact areas, wherein a top layer of the metal stack is configured to enable wire bonding.

A further illustrative method disclosed herein comprises forming a last metallization layer above a plurality of substrates, each of which comprises a device region and a test region. Furthermore, the method comprises selecting one of the plurality of substrates as a test substrate for assessing one or more characteristics of semiconductor devices provided in the device region. Moreover, a final dielectric layer stack is formed in the test region and the device region of the selected test substrate. The method additionally comprises forming a metal stack in the device region and the test region of the test substrate, wherein the metal stack connects to the last metallization layer and enables direct wire bonding. Furthermore, the method comprises forming a dielectric layer stack that has the same structure as the final dielectric layer stack and forming a further metal stack at least in the device regions of non-selected ones of the plurality of substrates. Finally, the method comprises forming a solder material on the further metal stack formed on the non-selected substrates.

An illustrative intermediate semiconductor product disclosed herein comprises a substrate and a plurality of die regions formed above the substrate and comprising semiconductor devices. The semiconductor product further comprises a test region positioned laterally adjacent to one or more of the plurality of die regions. Furthermore, a metallization system comprises a last metallization layer that is formed across the plurality of die regions and the test region. The intermediate semiconductor product further comprises a final dielectric layer stack formed in the plurality of die regions and the test region, wherein the final dielectric layer stack has the same configuration in the plurality of die regions and the test region. Finally, the intermediate semiconductor product comprises a metal layer stack formed in the test region in the final dielectric layer stack and having a top metal layer that is configured to enable wire bonding to the top metal layer.

BRIEF DESCRIPTION OF THE DRAWINGS

The disclosure may be understood by reference to the following description taken in conjunction with the accompanying drawings, in which like reference numerals identify like elements, and in which.

Figure 1A:
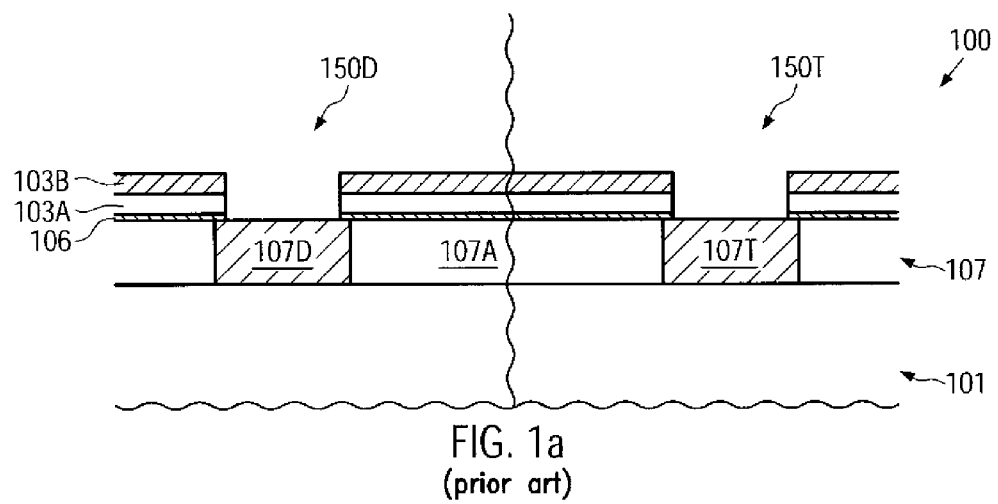
FIGS. 1a-1d schematically illustrate cross-sectional views of a conventional sophisticated semiconductor device during various manufacturing stages in forming a bump structure in a device region and a wire bond structure in a test region on the basis of aluminum according to conventional strategies.
Figure 1B:
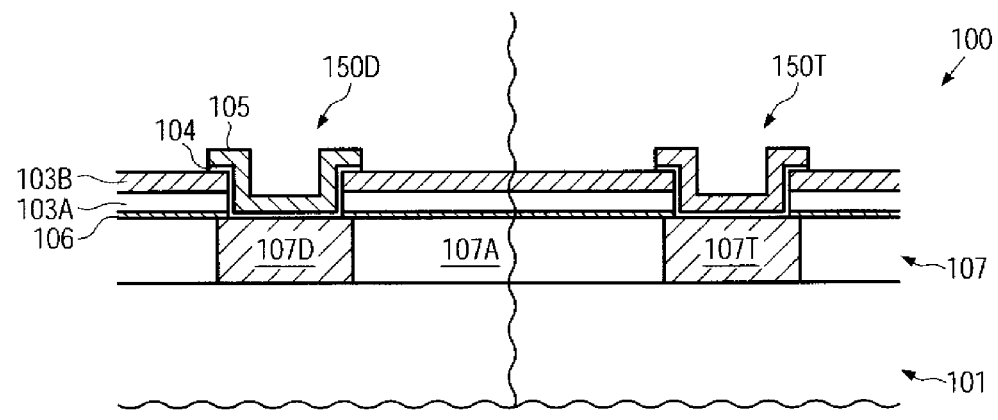
Figure 1C:
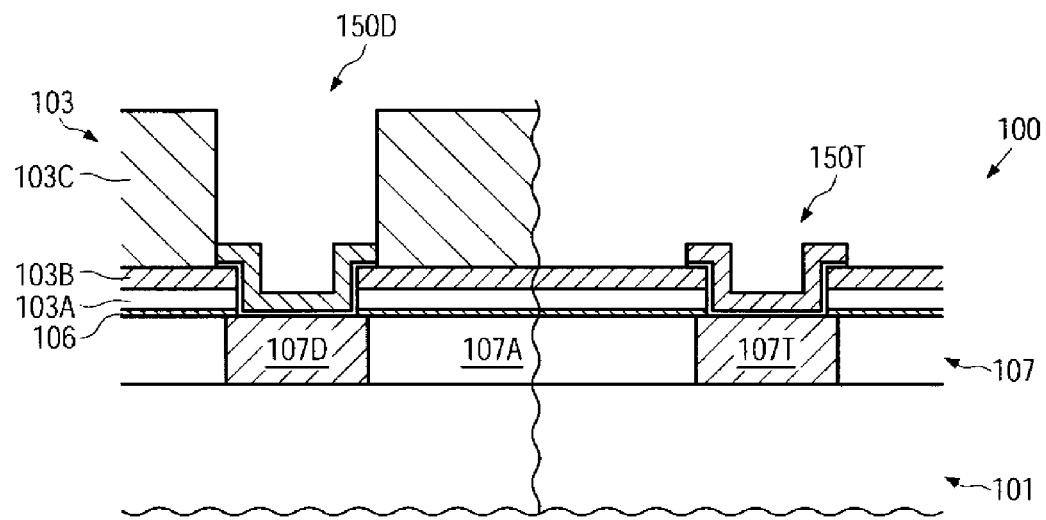
Figure 1D:
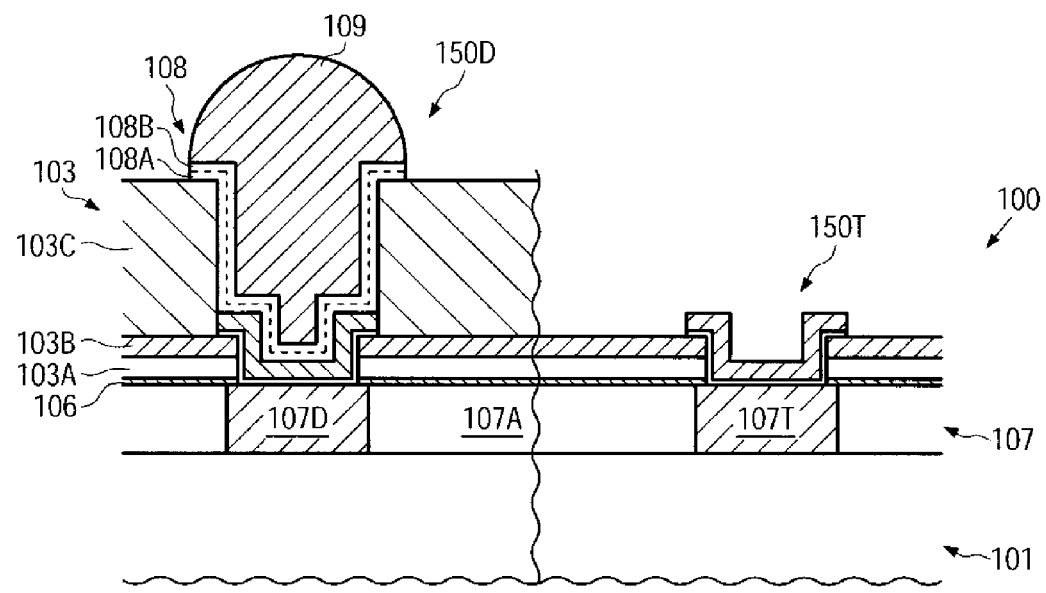

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In some illustrative aspects disclosed herein, an improved technique is provided which enables the formation of an appropriate bump structure with reduced process complexity, for instance, by avoiding the utilization of aluminum, while also maintaining the capability of using efficient wire bond techniques, at least in dedicated reliability or test substrates. For this purpose, a final dielectric layer stack, i.e., a layer stack comprising an appropriate passivation layer stack with a final dielectric passivation layer, may be provided with the same configuration in actual die or device regions and test regions in combination with an appropriate metal layer stack that enables the formation of an appropriate bump structure and also allows efficient wire bond techniques. The metal layer stack may thus be formed on the basis of appropriate deposition techniques, such as electrochemical deposition processes, in order to provide a material that acts as an efficient barrier material with respect to the bump material, while also providing the possibility of acting as an efficient wire bond material, wherein, in some illustrative aspects disclosed herein, additionally an appropriate top metal layer may be provided, for instance in the form of gold, thereby providing even further enhanced wire bonding capabilities.

In some illustrative embodiments disclosed herein, the metals of the metal layer stack may be provided in the form of respective metal components that may also be used in other manufacturing stages, thereby reducing the necessity for maintaining additional resources for the back end of line processing and reducing overall production costs. Furthermore, since highly complex aluminum-based deposition and patterning processes may be avoided, reduced cycle time may be accomplished while production yield may also be increased. Furthermore, since the final dielectric layer stack may be provided with the identical configuration in device regions and test regions, an enhanced degree of authenticity with respect to assessing process characteristics and material characteristics of the back end of line processing may be accomplished, for instance, when compared to the conventional strategy as explained with reference to FIGS. 1a-1d, in which the respective test regions substantially lack the final passivation layer, which may result in significantly different mechanical and chemical characteristics of respective test structures compared to actual semiconductor devices. Moreover, in some illustrative embodiments, a highly efficient overall process flow may be obtained by making a decision at an appropriate stage of the manufacturing flow, for instance, after forming and evaluating the very last metallization layer with respect to whether a respective substrate has to be used as a reliability substrate or has to be treated as a regular production substrate. For a dedicated test substrate, a modified manufacturing sequence may be used to provide respective wire bond pads in the test regions, possibly without requiring an actual bump structure above the device regions. On the other hand, the product substrate may further be processed on the basis of a highly efficient flow in which the fabrication of wire bond pads in the test regions of these product substrates may be omitted or may be only partially completed so as to reduce the number of required process steps. In other illustrative aspects disclosed herein, an operational bump structure may be provided in the die regions while a functional wire bond structure may also be provided in the test region while nevertheless providing reduced process complexity compared to the conventional strategy.

Figure 2A:
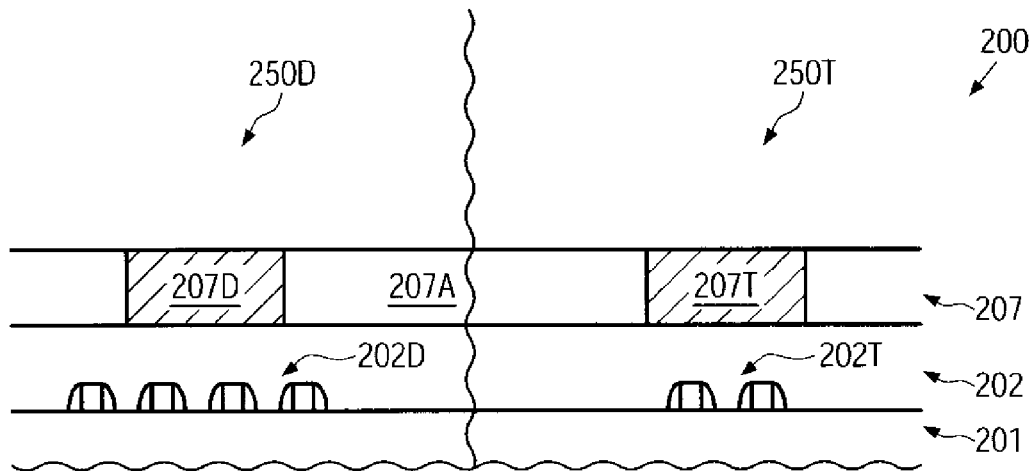
FIG. 2a schematically illustrates a semiconductor device after the formation of a final metallization layer above a device or die region and a test region.

FIG. 2a schematically illustrates a semiconductor device 200 in an advanced manufacturing stage. That is, the semiconductor device 200 may comprise a substrate 201 which may represent any appropriate carrier material for forming therein and thereabove device features, such as circuit elements, micromechanical features and the like. For instance, the substrate 201 may represent a silicon-based bulk substrate, a silicon-on-insulator (SOI) substrate, a substrate having formed therein SOI regions and bulk regions and the like. The substrate 201 may be divided into a plurality of device regions 250D, which correspond to areas in which functional entities are to be formed, such as integrated circuits, micromechanical devices in combination with electronic circuits and the like. The one or more device regions 250D, of which, for convenience, only one is illustrated in FIG. 2a, may represent respective die areas or regions of advanced integrated circuits. On the other hand, the substrate 201 may comprise areas in which microstructural features may be provided that are not intended to become "functional" entities but may be used during and after the production flow for estimating process flow characteristics, materials and the like. Respective areas may be referred to as test regions 250T and may be positioned laterally adjacent to the actual device regions 250D, wherein the actual device regions 250D may be separated from the test regions 250T by, for instance, die seal areas, i.e., respective metal-containing delineation areas and the like. Consequently, the substrate 201 may have formed therein or thereabove a device layer 202, which may comprise a plurality of circuit elements 202D in the device region 250D and which may also comprise one or more test features 202T positioned in the test region 250T. For example, the test features 202T may include respective elements for estimating the reliability of gate dielectrics, strain characteristics of semiconductor materials and the like. Similarly, in higher levels of the device 200, the test structure 202T may include metallization features for estimating the reliability, for instance with respect to electromigration or other stress-induced contact degradation mechanisms, of respective metallization systems used in the actual device regions 250D.

Furthermore, the semiconductor device 200 may comprise a plurality of metallization layers including metal lines and vias connecting metal lines of different stacked metallization levels, which, in some illustrative embodiments, may be formed on the basis of copper material in combination with low-k dielectric materials, which are to be understood as dielectric materials having a relative permittivity of 3.0 and less. For convenience, a metallization layer 207 is illustrated in FIG. 2a and is to represent the very last metallization layer of the device 200. Thus, the metallization layer 207 may comprise a dielectric material 207A, which may be comprised of a low-k dielectric material, possibly in combination with conventional dielectrics, such as silicon dioxide, silicon nitride, silicon oxynitride and the like. Furthermore, respective metal regions 207D, 207T may be formed in the dielectric material 207A and may, in some illustrative embodiments, represent copper-based metal regions which may comprise copper, copper alloys in combination with appropriate barrier materials (not shown). It should be appreciated that the metal regions 207D in the device region 250D, only one of which is shown in FIG. 2a, may be provided with appropriate lateral size and location that is appropriate for forming thereon a bump structure as required for a direct contact of a carrier substrate to the device region 250D after dicing the substrate 201. Similarly, the metal regions 207T in the test region 250T, only one of which is shown for convenience, are appropriately dimensioned and positioned so as to enable wire bonding to respective bond pads still to be formed.

Figure 2B:
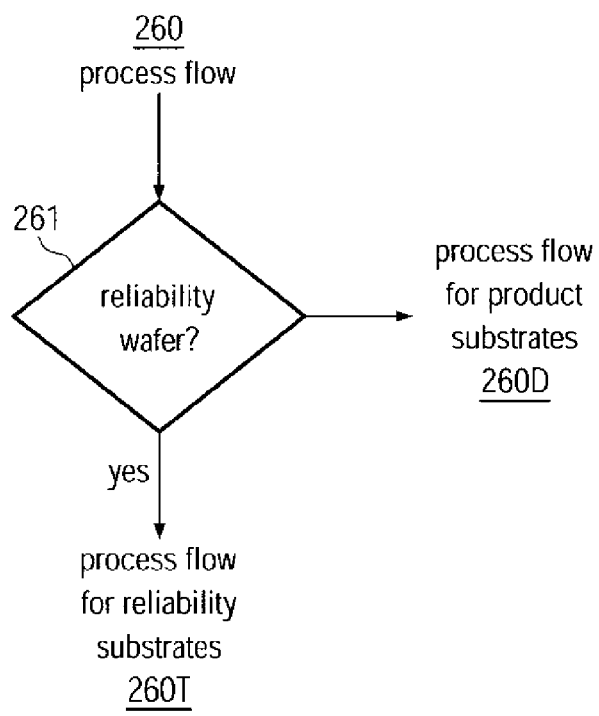
FIG. 2b schematically illustrates a decision making process to classify a substrate as a reliability or test substrate or as a product substrate, according to illustrative embodiments.
Figure 2C:
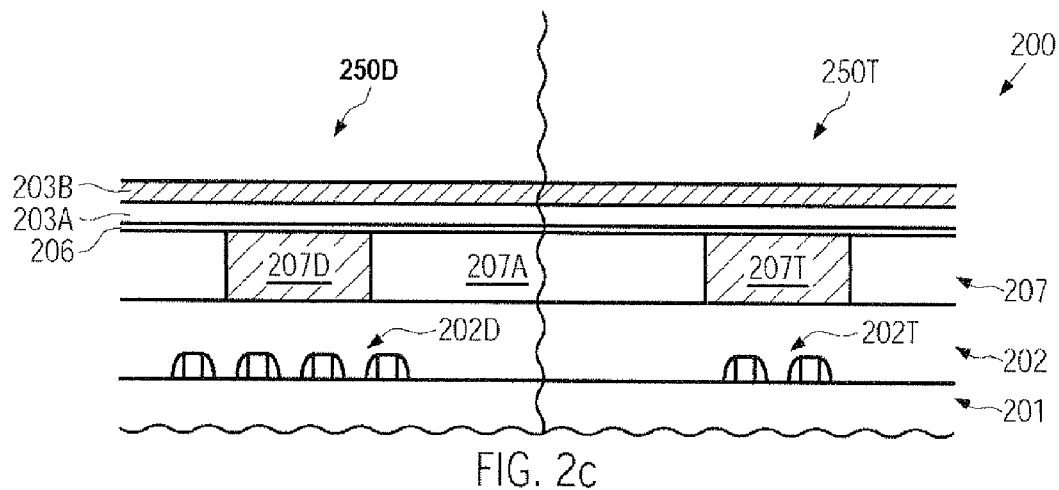
FIGS. 2c-2f schematically illustrate cross-sectional views during various manufacturing stages in forming a contact structure configured for wire bonding in the test region on the basis of a common final dielectric layer stack that may have the same configuration in actual device regions, according to further illustrative embodiments.

The semiconductor device 200 as shown in FIG. 2a may be formed on the basis of similar process techniques as are described with reference to the semiconductor device 100 except for the provision of any passivation layers above the cap layer 206 (FIG. 2c).

As previously discussed, during the manufacturing of sophisticated semiconductor devices, such as the device 200, a plurality of inspection and measurement steps have to be performed in order to monitor and control respective manufacturing processes. For this purpose, test structures, which may be positioned in the test region 250T or in any other area, such as the device region 250D, may be used for obtaining the desired measurement data. For example, typically, respective measurement procedures may be performed after forming a respective one of the metallization layers, such as the metallization layer 207, in order to obtain measurement data with respect to defect rate, electrical characteristics and the like. For example, on the basis of the last metallization layer 207, respective measurements may be performed to determine electrical parameters, characteristics of the manufacturing flow and the like. According to illustrative embodiments disclosed herein, at any point prior to or up to performing respective measurement processes for the very last metallization layer 207, it may be decided whether or not the substrate 201 of the device 200 is to be considered as a test substrate or a product substrate.

FIG. 2b schematically illustrates a portion of the overall manufacturing process flow 260, in which at any point prior to forming an appropriate bump structure and wire bond structure, a decision 261 may be made as to whether the substrate under consideration, such as the substrate 201, is to be used as a test substrate, for instance for reliability assessment, or an actual product substrate in which wire bonding to the test region 250T may not be required. The decision 261 may be made at any point, wherein, in one illustrative embodiment, the decision 261 may be made after forming the last metallization layer 207 and performing respective measurement processes to obtain measurement data. For example, electrical measurement data may indicate that the device features 202D may suffer from inferior performance, and in this case the substrate 201 may be considered as a reliability substrate or test substrate so as to obtain information on grounds of the reduced performance characteristics while at the same time not significantly contributing to reduced production yield if some or all of the device regions 250D would not be used as actual products. In other cases, any point in the process flow 260 prior to the formation of a bump structure and a wire bond structure may be selected as an appropriate point in time for the making the decision 261. Thus, in the embodiment shown in FIG. 2b, the process flow 260 may be split into a first branch 260T corresponding to a "yes" in the decision 261 and a second branch 260D corresponding to a "no" in the decision 261. Thus, in the illustrative embodiment shown in FIG. 2b, the different process sequences 260D, 260T may be followed so as to enhance the overall process efficiency since, for instance, reduced process complexity may be provided during the process 260D, as will be described later on, thereby enabling the manufacturing of the actual product substrates on the basis of less complex manufacturing steps. On the other hand, a very limited number of test substrates may be processed according to the process flow 260T, wherein one or more additional process steps may be used to provide a desired wire bond structure in the test regions 250T, while nevertheless providing a high degree of compatibility with the process flow 260D, that is, at least the final dielectric passivation layer stack may be formed with the same configuration, thereby providing a high degree of comparability of respective measurement data.

With reference to FIGS. 2c-2g, the semiconductor device 200 will be described during various manufacturing stages in embodiments corresponding to the process flow 260T, i.e., when the substrate 201 of the semiconductor device 200 has been selected as a reliability or test substrate during the decision 261.

As shown, the semiconductor device 200 may comprise, in this manufacturing stage, the metallization layer 207 comprising a cap layer 206, for instance in the form of silicon nitride, silicon carbide, nitrogen-containing silicon carbide, so as to reliably confine the metal regions 207D, 207T. One or more passivation layers 203A, 203B may be provided which may be comprised of any appropriate material, such as silicon dioxide, silicon oxynitride and the like. In the embodiment shown, two different passivation layers 203A, 203B, for instance in the form of silicon dioxide and silicon oxynitride, may be provided, while, in other illustrative embodiments (not shown), any other number of layers may be used, as long as a required passivating effect is obtained. For instance, a single passivation layer or more than two individual passivation layers may be provided on the basis of an appropriate material composition and layer thickness. For example, the type and the thickness of the passivation layers 203A, 203B may be selected differently compared to the conventional approach, as for instance described with reference to FIGS. 1a-1d, since the one or more passivation layers 203A, 203B may not be exposed to complex etch processes, as are required in the conventional strategy for patterning a barrier layer and an aluminum layer. Thus, the one or more passivation layers 203A, 203B may be provided with less restrictive constraints, thereby providing enhanced flexibility in selecting an appropriate material, possibly in combination with reducing the overall layer thickness. The passivation layers 203A, 203B may be formed on the basis of well-established deposition techniques, such as PECVD and the like.

Figure 2D:
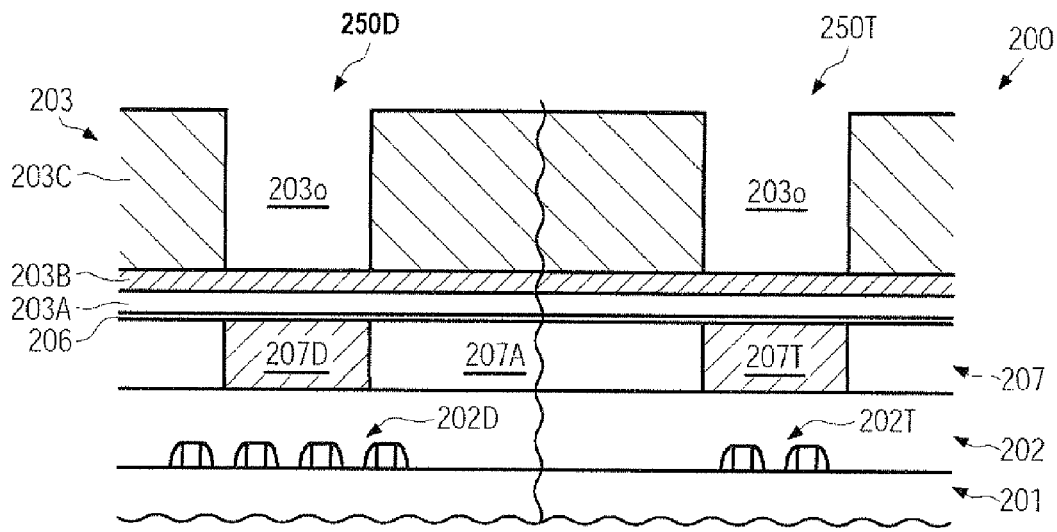

FIG. 2d schematically illustrates the semiconductor device 200 in a further advanced manufacturing stage in which a final passivation layer 203C is formed above the passivation layers 203A, 203B. The layers 203A, 203B and 203C may thus define a final dielectric layer stack in the sense as previously defined with respect to the device 100, i.e., the final dielectric layer stack 203 represents the final dielectric material in and above which may be formed a bump structure and/or a wire bond structure, as will be described later on in more detail. In some illustrative embodiments, the final passivation layer 203C may be provided in the form of a polymer material which in some cases may be provided as a photosensitive material, such as photosensitive polyimide, which may be patterned on the basis of an appropriate lithography technique by exposing the layer 203C so as to form therein a latent image which may subsequently be "developed" to form respective openings 203o that correspond to the metal regions 207D, 207T, respectively. In some illustrative embodiments, when access to the metal region 207D may not be required, the final passivation layer 203C may be patterned so as to substantially completely cover the device region 250D. In any case, the final dielectric layer stack 203 may be provided in both the region 250D and the region 250T with the same configuration without requiring extended portions in the region 250T, in which the final passivation layer 203C may be missing, for instance, in view of providing a surface topography appropriate for wire bonding.

Figure 2E:
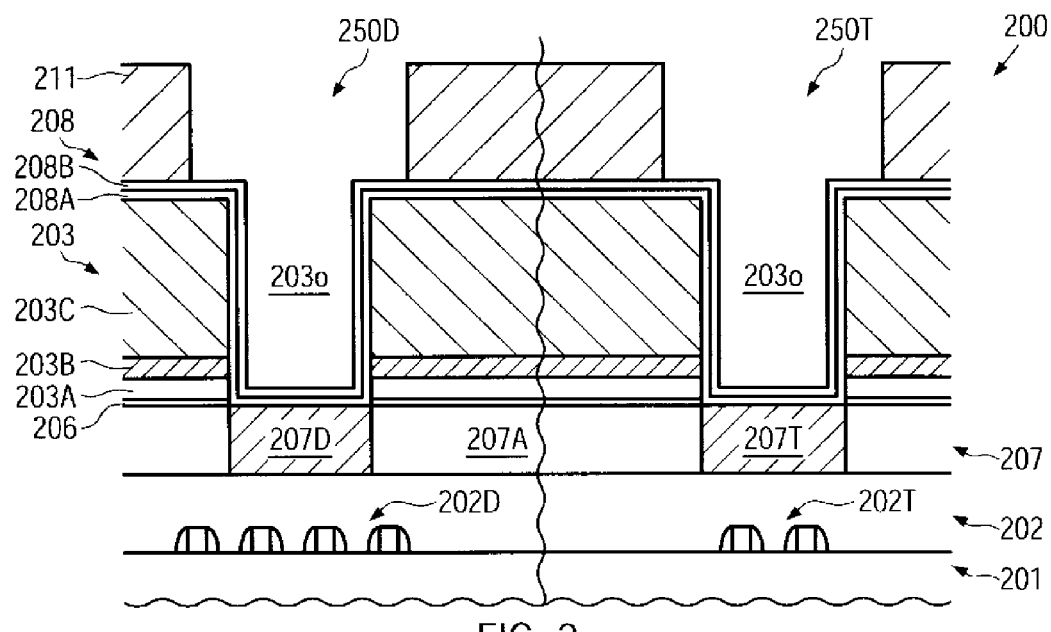

FIG. 2e schematically illustrates the semiconductor device 200 in a further advanced manufacturing stage. As shown, the device 200 may comprise a conductive liner material 208, which may be considered as a type of "underbump metallization layer," which, however, may not come into direct contact with a respective solder bump material, as will be explained later on in more detail. The conductive liner material 208 may comprise two or more sub-layers 208A, 208B comprised of different materials to provide the desired characteristics with respect to adhesion, diffusion blocking capability, deposition characteristics and the like. In one illustrative embodiment, the conductive liner material 208 may comprise the first layer 208A in the form of a titanium layer having a thickness in the range of approximately 50-150 nm, for example, with a thickness of approximately 80-120 nm. In other illustrative embodiments, the layer 208A may be comprised of titanium and tungsten with a thickness corresponding to the above-identified range. Thus, the layer 208A may provide sufficient adhesion with respect to the underlying metal region 207D, 207T, which may be comprised of copper, copper alloys or any other appropriate metal. Furthermore, the second conductive layer 208B may be provided in the form of a material that may facilitate a subsequent deposition of a further metal to fill the opening 203o that may also provide the desired compatibility with wire bonding techniques and also with the formation of a bump structure. In one illustrative embodiment, the layer 208B may be provided in the form of a copper layer having a thickness in the range of approximately 100-300 nm. For instance, in some embodiments, the layer 208B may have a thickness of approximately 180-220 nm.

Moreover, in this manufacturing stage, the device 200 may further comprise a deposition mask 211, for instance, in the form of a photoresist mask, which may at least expose the openings 203o. The mask 211 may thus define the final lateral dimension of a respective bond pad to be formed in the test region 250T, while, in the embodiment shown, the mask 211 may also define the lateral dimension of a bump structure in the device region 250D, if required.

The device 200 as shown in FIG. 2e may be formed on the basis of the following processes. Exposed portions of the passivation layers 203A, 203B may be etched on the basis of the opening 203o, wherein the cap layer 206 may also be opened, thereby exposing at least a portion of the metal region 207T and, in the embodiment shown, of the metal region 207D, thereby also defining respective contact areas which, for convenience, may also be referred to as contact areas 207T, 207D. Thereafter, the conductive layers 208, for instance in the form of the layers 208A, 208B, may be formed on the basis of appropriate deposition techniques, such as sputter deposition and the like. For example, sputter deposition techniques for titanium, titanium/tungsten, copper and a plurality of other materials are well established in the art and may be used for forming the conductive layers 208. Next, the deposition mask 211 may be formed, for instance, on the basis of photolithography, using an appropriate lithography mask to define the lateral dimension and position of a wire bond structure still to be formed in the test region 250T. Based on the deposition mask 211, an appropriate metal may be filled into the openings 203o by an electrochemical deposition process, in which the layers 208A, 208B may act as efficient current distribution layers and may also act as a material surface for initiating electrochemical deposition of the metal under consideration. In one illustrative embodiment, the metal deposited in the openings 203o may comprise nickel, while, in other embodiments, other appropriate metals such as tungsten and the like may be used.

Figure 2F:
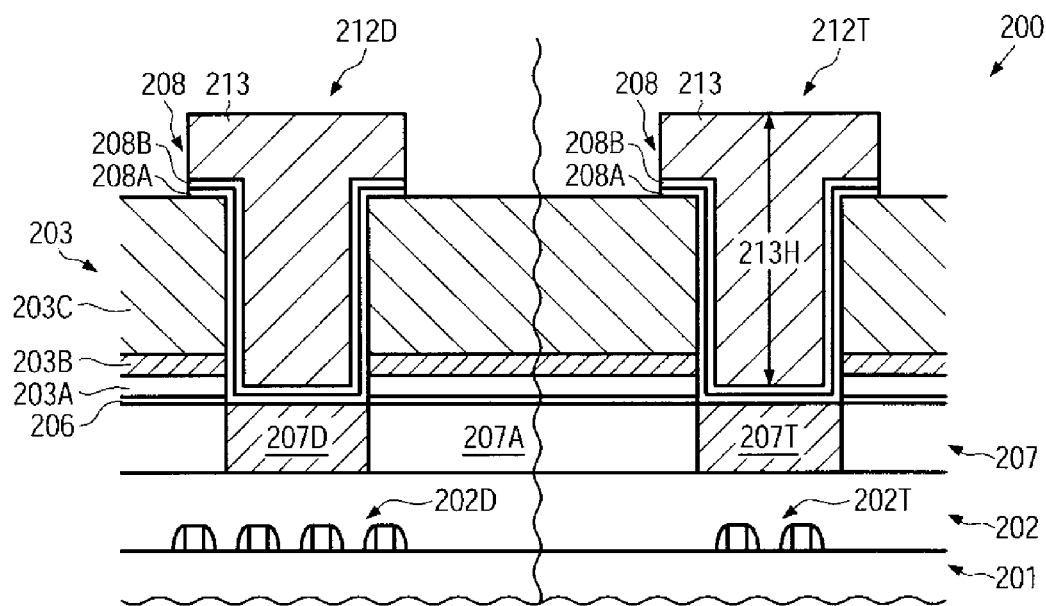

FIG. 2f schematically illustrates the device 200 in a further advanced manufacturing stage. As shown, the device 200 may comprise a metal stack 212T at least in the test region 250T including portions of the layers 208A, 208B and a metal 213, such as nickel, tungsten and the like. In one illustrative embodiment, the metal 213 is selected so as to enable a direct wire bonding on a surface portion thereof. For example, well-established wire bond techniques are available for nickel. In the embodiment shown, a respective metal layer stack 212D may also be provided in the device region 250D, which, in this manufacturing phase, may have the same configuration as the metal layer stack 212T with respect to the sequence of the various metal layers 208A, 208B and 213. The metal 213 may be provided with a thickness or height 213H that is substantially defined by the thickness of the final dielectric stack 203 and a desired excess height, which may be adjusted on the basis of the deposition time of a respective electrochemical deposition process. In some illustrative embodiments, the height 213H may be adjusted to a range of approximately 1-3 µm, depending on the process and device requirements. By way of example, in some cases, the height 213H may be selected to be approximately 1.8-2.2 µm. After the electrochemical deposition of the metal layer 213, the deposition mask 211 may be removed, for instance, on the basis of well-established resist etch processes, followed by an etch process for removing exposed portions of the layers 208B, 208A, thereby providing the metal layer stacks 212T as electrically isolated layer stacks. The removal of the exposed portions of the layers 208A, 208B may be accomplished on the basis of well-established etch techniques, such as established wet chemical etch techniques or plasma assisted etch processes, or any combination thereof. During the corresponding etch process, the metal 213 may be used as an effective etch mask, wherein a certain degree of under-etching may depend on the process strategy. For example, when titanium or titanium/tungsten material in combination with copper material is used for the layers 208A, 208B, respective conventional etch recipes may be used since these materials are frequently used as underbump metallization layers in conventional semiconductor devices.

Consequently, according to the process flow 260T (see FIG. 2b), the metal layer stack 212T may be provided in the test region 250T, and possibly in the device region 250D, if desired, wherein the top layer of the stack 212T, i.e., in the embodiment shown, the material 213, may be configured to enable directly bonding a wire upon assembling the test region 250T. Furthermore, the process flow for forming the final dielectric layer stack 203 is performed concurrently in the device region 250D and the test region 250T, thereby obtaining the same configuration which translates into a high degree of authenticity when obtaining respective experimental data on the basis of the test region 250T, in particular with respect to the metallization system of the device 200. As will be explained later on in more detail, the metal layer stack 212D as provided in the device region 250D may also be used as a basic configuration for forming a solder material so that substantially the same configuration of the contact structure may be obtained for test regions and device regions, irrespective of whether the substrate 201 may represent a test substrate, as is the case for the embodiments shown with reference to FIGS. 2d-2f, or where the substrate 201 represents an actual product substrate, as will be explained later on. Hence, a wire bond structure and/or a bump structure may be formed on the basis of a process sequence of reduced complexity compared to conventional approaches, due to avoiding complex patterning processes for patterning barrier/adhesion layers and aluminum layers, while also reducing the necessity for maintaining additional resources in the manufacturing line compared to conventional strategies due to the possibility of completely avoiding any aluminum-based metals. Consequently, the semiconductor device 200, which may be considered as an intermediate semiconductor product in the sense that further process steps may be required to actually complete the structures corresponding to the test region 250T, and devices on the basis of the device regions 250D, as will be described later on, may be formed on the basis of reduced process complexity and increased overall production yield.

Figure 2G:
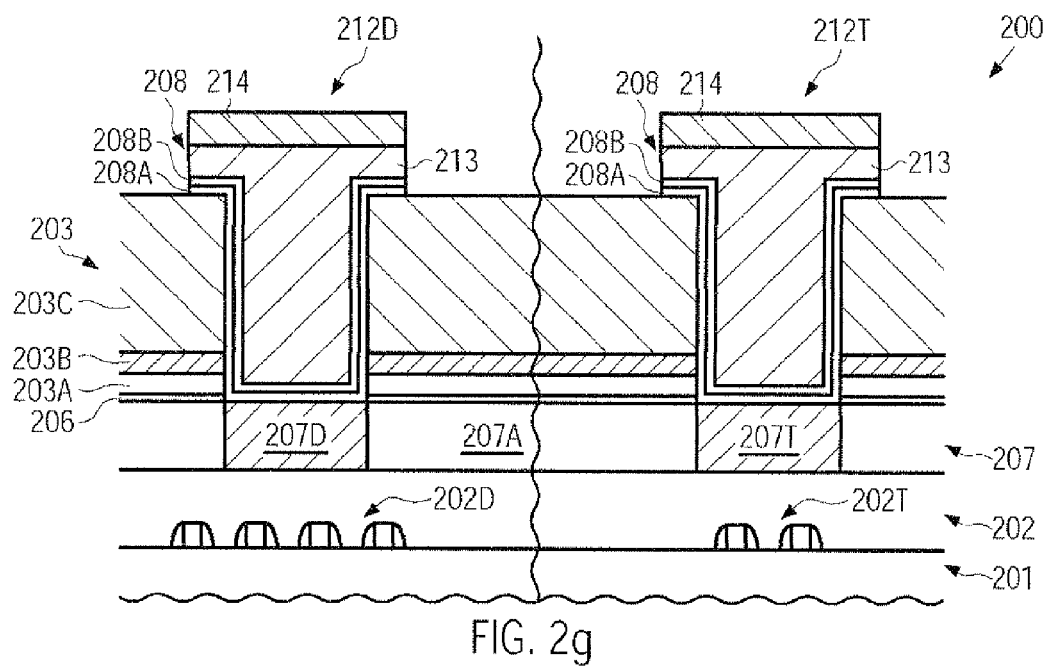
FIG. 2g schematically illustrates the semiconductor device including a contact structure of enhanced wire bonding capability, according to still further illustrative embodiments.

FIG. 2g schematically illustrates the semiconductor device 200 according to further illustrative embodiments in which the metal layer stack 212T and the stack 212D, if provided, may comprise a top metal layer 214, which may provide superior wire bonding capabilities if a metal layer 213 is less efficient during a wire bonding process. In one illustrative embodiment, the top layer 214 may comprise gold, for which well-established and efficient wire bond techniques are available in the art. The top layer 214 may be formed on the basis of an electrochemical deposition process, for instance, on the basis of the deposition mask 211 (FIG. 2e), in which the lateral dimensions of the layer 214 substantially correspond to the lateral dimension of the material 213. For this purpose, after the electrochemical deposition of the material 213, an appropriate electrolyte solution may be provided in order to form the top layer 214 with a desired thickness, which may be in the range of approximately 50-200 nm, wherein, in one example, a thickness of approximately 80-120 nm may be used. In other cases, the top layer 214 may be deposited on the basis of an electroless deposition process, possibly after the provision of an appropriate catalyst material on surface portions of the material 213, wherein the material 214 may be provided on the basis of the deposition mask 211 or may be formed after the removal thereof and the patterning of the liner materials 208A, 208B. Consequently, the characteristics of the metal layer stack 212T with respect to its behavior during a wire bonding process may be adjusted on the basis of the top metal layer 214, while the remaining material of the metal stack 212T, 212D, i.e., the materials 208A, 208B, 213, may be selected so as to be highly efficient with respect to forming a solder bump structure in the device region 250D, if required, or in respective device regions of product substrates.

With reference to FIGS. 2h-2k, further illustrative embodiments will now be described in which the device 200 is processed according to the process flow branch 260D (FIG.

2b), i.e., the substrate 201 is considered as a product substrate that may not necessarily require appropriate bond pads in the test region 250T.

Figure 2H:
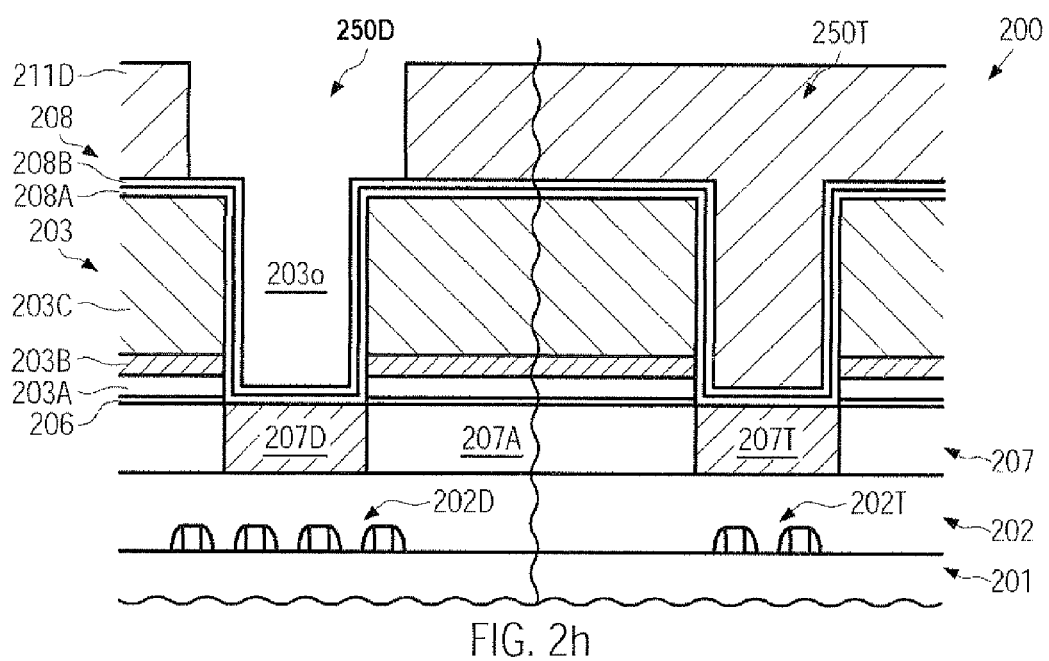
FIGS. 2h-2j schematically illustrate cross-sectional views of a semiconductor device during various manufacturing stages in forming a bump structure above actual die regions in product substrates without requiring a wire bonding structure in the respective test regions, according to illustrative embodiments.

FIG. 2h schematically illustrates the device 200 in a manufacturing stage in which the final passivation layer 203C has been patterned to have at least an opening 203o in the device region 250D, wherein the respective opening may not necessarily have to be provided in the test region 250T. In the illustrative embodiment shown in FIG. 2h, however, the respective opening 203o may also be formed in the test region 250T thereby allowing the usage of the same lithography mask for substrates and actual product substrates. In other cases, the final passivation layer 203C may be patterned so as to be substantially completely removed from the test region 250T, if desired. Furthermore, the conductive liner material 208 is formed, which may be accomplished with the same process techniques as previously described. Furthermore, in this manufacturing stage, a deposition mask 211D may be provided, for instance, in the form of a resist mask and the like, which may appropriately define the lateral size of a bump structure in the device region 250D, while covering the test region 250T. After patterning the deposition mask on the basis of respective lithography techniques, the deposition of metal material 213 may be initiated on the basis of any appropriate electrochemical deposition techniques, as previously described. For example, any appropriate metal, such as nickel, tungsten and the like, may be deposited by electroplating, electroless plating and the like. It should be appreciated that substantially the same process sequence may be used as previously described for the process flow branch 260T, thereby obtaining a high degree of compatibility between test substrates and product substrates. Thereafter, in some illustrative embodiments, a further material may be deposited on the basis of an electrochemical deposition process in order to provide a metal for a bump structure, such as a solder material in the form of a tin/lead compound, or any other appropriate bump or solder material without lead. Thus, the previously deposited material may act as an efficient barrier material for the actual bump material, thereby enabling the formation of bump structures and wire bond structures using the final dielectric layer stack 203 and at least a significant portion of metal layer stack 212D, 212T in both the test substrates and the product substrates.

Figure 2I:
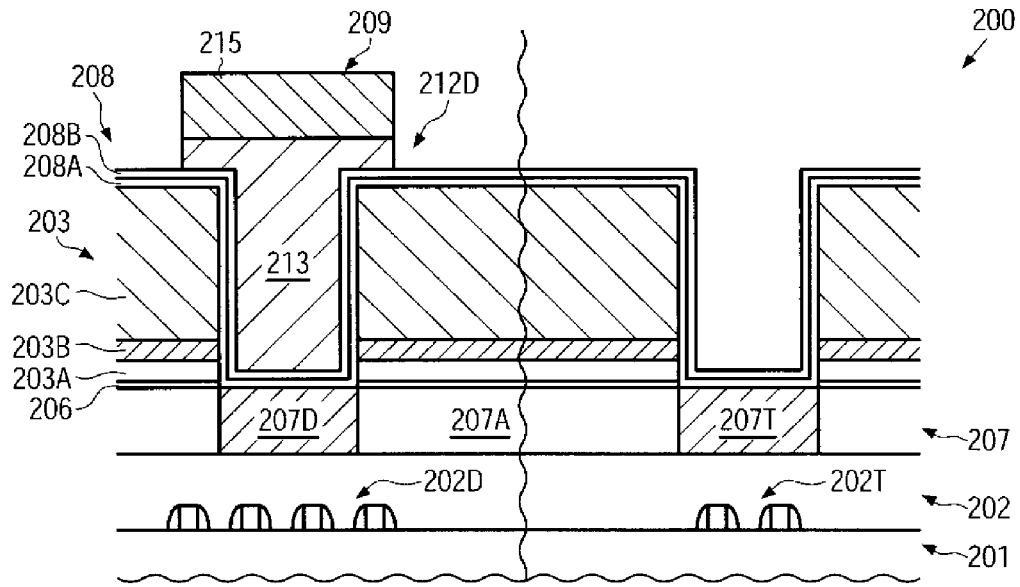

FIG. 2i schematically illustrates the device 200 after the above-described process sequence and after the removal of the deposition mask 211D. Thus, as shown, a bump structure 209 is formed in the device region 250D, which may comprise a metal stack 212D, as for instance shown in FIG. 2f, including a bump material 215, as previously explained. Thus, in this embodiment, the lateral dimensions of the metals 213 and 215 may be defined by the deposition mask 211D. In other illustrative embodiments (not shown), different lateral dimensions may be used, for instance, by different deposition masks if, for instance, an increased or reduced lateral dimension of the bump material 215 is desired.

Figure 2J:
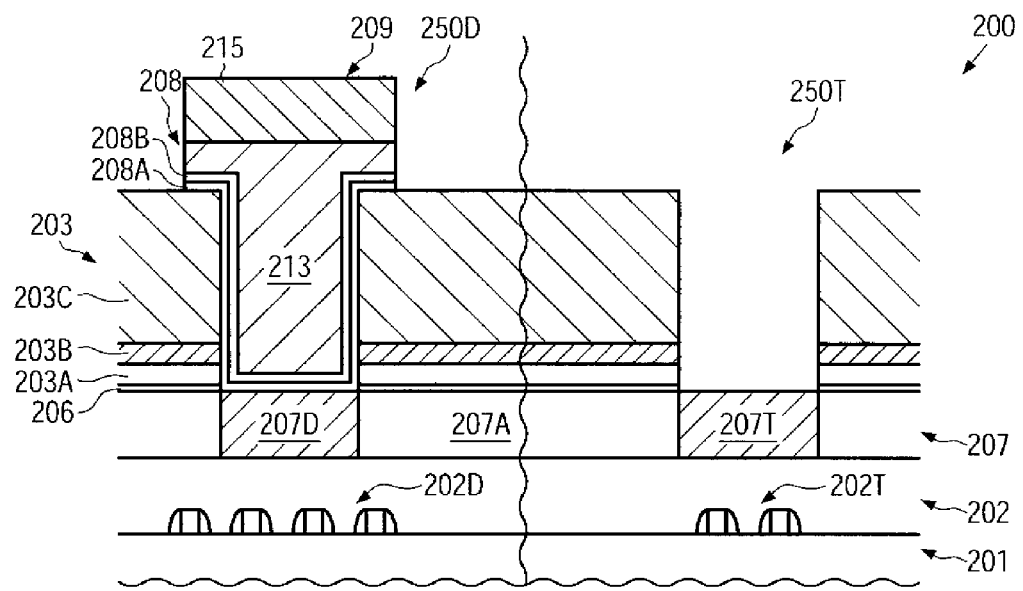

FIG. 2j schematically illustrates the device 200 after a corresponding etch process, as previously described, to remove exposed portions of the conductive layers 208A, 208B. During a corresponding etch process, the metal region 207T may also be exposed which, however, may not negatively affect the further processing of the device 200, since the test region 250T may not be used during the further process. Consequently, the device 200, when representing an actual product substrate, may be formed on the basis of essentially the same process techniques and materials as previously described with reference to the device 200 when representing a test substrate.

Figure 2K:
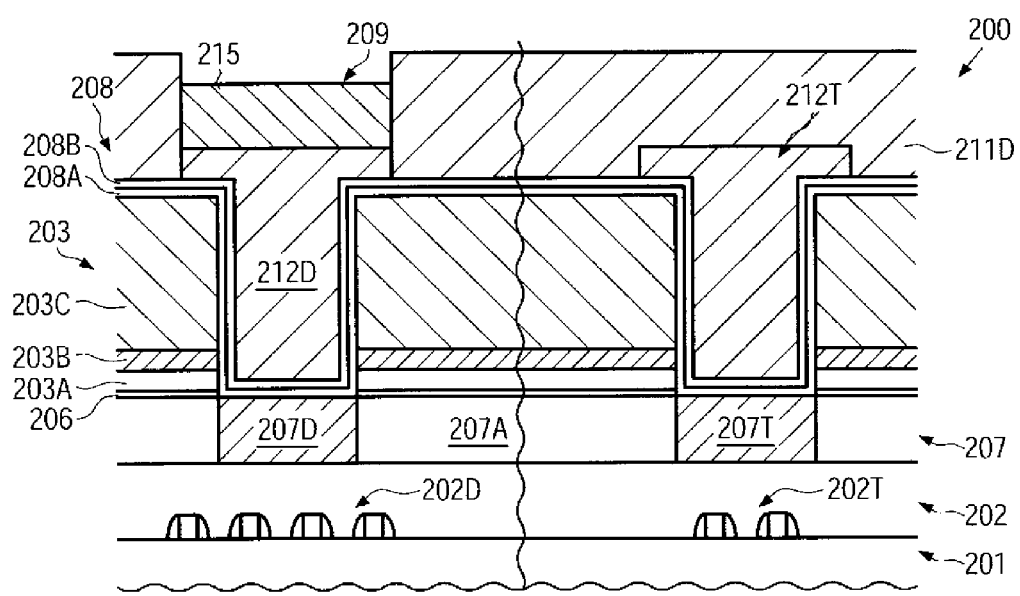
FIG. 2k schematically illustrates a cross-sectional view of a semiconductor device during a manufacturing phase in which a bump structure is formed in a die region, while a wire bonding structure is formed in a test region on the basis of the same final dielectric layer stack, in accordance with still other illustrative embodiments.

FIG. 2k schematically illustrates the semiconductor device 200 according to illustrative embodiments in which the bump structure 209 is to be provided in the device region 250D and concurrently the metal stack 212T configured for direct wire bonding is to be provided in the test region 250T on the same substrate.

FIG. 2k schematically illustrates the semiconductor device 200 comprising the metal layer stacks 212D, 212T which may have been formed on the basis of the process strategy as previously explained with reference to FIGS. 2c-2f. Thus, the stacks 212D, 212T, as well as the final dielectric layer stacks 203, may have the same configuration in the device region 250D and the test region 250T. That is, the material 213 of the metal layer stacks 212D, 212T have been formed on the basis of the deposition mask 211 (FIG. 2e). In the embodiment shown, furthermore, the deposition mask 211D (FIG. 2h) may be provided to expose the metal layer stack 212D while covering the metal layer stack 212T. Based on the deposition mask 211D, an electrochemical deposition process may be performed, as previously described, in order to deposit the bump material 215 while avoiding a deposition of this bump material in the test region 250T. Thereafter, the deposition mask 211D may be removed and exposed portions of the liner material 208 may also be removed, as previously described, while using the bump structure 209 and the metal layer stacks 212, respectively, as an etch mask. Thus, in these illustrative embodiments, the metal layer stack 212T may comprise the metal 213 in the form of a metal that enables a direct wire bond process, such as nickel, wherein this material may also act as an efficient barrier material in the bump structure 209, thereby enabling the formation of the bump structure 209 and the wire bond structure in the form of the metal layer stack 212T concurrently on the same substrate 201, while only requiring one additional lithography process for providing the deposition mask 211D. Thus, also in this case, a highly efficient process sequence may be provided compared to conventional strategies, without requiring the decision 261 (FIG. 2b) since the device regions 250D and the test regions 250T comprised in the same substrate 201 may be contacted according to bump techniques and wire bond techniques, respectively.

As a result, the subject matter disclosed herein provides an enhanced technique and a respective semiconductor product at an intermediate manufacturing stage, in which a bump structure and a structure configured for direct wire bonding may be obtained on the basis of the same process sequence, thereby providing at least the final dielectric layer stacks of the same configuration and also respective metal layer stacks of similar configuration in test regions and device regions. Thus, in addition to reducing overall process complexity, superior authenticity of respective measurement data may be achieved while the possibility of avoiding highly complex aluminum-based back end of line process steps may result in reduced production costs and enhanced yield. In one illustrative embodiment, the number of lithography steps may be reduced by making a decision between test substrates and actual product substrates at any appropriate point during the manufacturing flow prior to actually providing a bump structure. Thus, essentially aluminum-free wire bond structures and bump structures may be provided, thereby reducing respective resources in terms of equipment in the back end of line processing.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a final dielectric layer stack above a last metallization layer formed above a substrate, said final dielectric layer stack comprising a passivation layer stack and a final dielectric layer above said passivation layer stack and said last metallization layer comprising a first contact area connected to a device region including a semiconductor device and a second contact area connected to a test region;
    patterning said final dielectric layer stack after forming said final dielectric stack to expose said first and second contact areas; and
    forming a metal stack on said final dielectric layer stack and said exposed first and second contact areas after patterning said final dielectric stack, a top layer of said metal stack being configured to enable wire bonding.

2. The method of claim 1, wherein said metal stack is substantially free of aluminum.

3. The method of claim 1, wherein forming said final dielectric layer stack comprises forming said passivation layer stack and forming said final dielectric layer on said passivation layer stack.

4. The method of claim 3, wherein said final dielectric layer is provided in the form of a polymer material.

5. The method of claim 4, wherein patterning said final dielectric layer stack comprises exposing said polymer material to radiation to form a latent image therein and removing portions of said latent image that correspond to said first and second contact areas.

6. The method of claim 1, wherein forming said metal stack comprises depositing one or more conductive layers on said patterned final dielectric layer stack and said exposed first and second contact areas.

7. The method of claim 6, further comprising forming a deposition mask on said one or more conductive layers to expose on upper most one of said one or more conductive layers above said first and second contact areas and depositing a first metal by an electrochemical deposition technique.

8. The method of claim 7, further comprising depositing a second metal on said first metal.

9. The method of claim 7, wherein said first metal comprises nickel.

10. The method of claim 8, wherein said second metal comprises gold.

11. The method of claim 8, wherein said second metal is deposited by one of electroplating and electroless plating.

12. The method of claim 11, wherein said second metal is deposited with a thickness in the range of approximately 50-200 nm.

13. The method of claim 6, wherein a first conductive layer is deposited to act as an adhesion layer with respect to said first and second contact areas and wherein a second conductive layer is deposited above said first conductive layer, said second conductive layer acting as a base layer for performing an electrochemical deposition process.

14. The method of claim 13, wherein said first conductive layer comprises at least one of titanium and tungsten and said second conductive layer comprises copper.

15. A method, comprising:
    forming a last metallization layer above each of a plurality of substrates, each of said plurality of substrates comprising a device region and a test region;
    selecting one of said plurality of substrates as a test substrate for assessing one or more characteristics of semiconductor devices provided in said device region;
    forming a final dielectric layer stack in said test region and said device region of said selected test substrate, said final dielectric layer stack comprising a passivation layer stack and a dielectric layer formed above said passivation layer;
    patterning said final dielectric stack of said selected substrate after forming said final dielectric stack to expose a first portion of said device region and a second portion of said test region;
    forming a metal stack after patterning said final dielectric stack over said first and second exposed portions of said device region and said test region of said test substrate, said metal stack connecting to said last metallization layer and enabling direct wire bonding;
    forming a dielectric layer stack having a structure of said final dielectric layer stack and a further metal stack at least in said device regions of non-selected ones of said plurality of substrates; and
    forming a solder material on said further metal stack formed on said non-selected substrates.

16. The method of claim 15, wherein said metal stack and said further metal stack are formed so as to have the same sequence of metal layers except for a top metal layer of said metal stack.

17. The method of claim 15, wherein said metal stack and said further metal stack are formed to have the same sequence of metal layers.

18. The method of claim 15, wherein said metal stack and said further metal stack comprise titanium and nickel.

* * * * *